US008475589B2

(12) United States Patent
Kuragaki

(10) Patent No.: US 8,475,589 B2
(45) Date of Patent: Jul. 2, 2013

(54) METHOD FOR EVALUATING METAL CONTAMINATION OF SILICON SINGLE CRYSTAL

(75) Inventor: Shunji Kuragaki, Tokyo (JP)

(73) Assignee: Sumco Corporation, Tokyo (JP)

( * ) Notice: Subject to any disclaimer, the term of this patent is extended or adjusted under 35 U.S.C. 154(b) by 1085 days.

(21) Appl. No.: 12/385,386

(22) Filed: Apr. 7, 2009

(65) Prior Publication Data
US 2009/0255456 A1 Oct. 15, 2009

(30) Foreign Application Priority Data

Apr. 10, 2008 (JP) ................... 2008-102320

(51) Int. Cl.
| | |
|---|---|
| *C30B 11/00* | (2006.01) |
| *C30B 15/00* | (2006.01) |
| *C30B 21/06* | (2006.01) |
| *C30B 27/02* | (2006.01) |
| *C30B 28/10* | (2006.01) |
| *C30B 30/04* | (2006.01) |
| *C30B 9/00* | (2006.01) |
| *C30B 17/00* | (2006.01) |
| *C30B 21/02* | (2006.01) |
| *C30B 28/06* | (2006.01) |

(52) U.S. Cl.
USPC .................. 117/15; 117/11; 117/13; 117/14; 117/73

(58) Field of Classification Search
USPC ................... 117/15, 11, 13, 14, 73
See application file for complete search history.

(56) References Cited

U.S. PATENT DOCUMENTS

| | | | | |
|---|---|---|---|---|
| 4,330,359 | A | * | 5/1982 | Lovelace et al. ............... 117/26 |
| 6,228,165 | B1 | * | 5/2001 | Baba et al. ...................... 117/29 |
| 2005/0000404 | A1 | * | 1/2005 | Kishi et al. ..................... 117/13 |
| 2010/0126408 | A1 | * | 5/2010 | Miyahara et al. .............. 117/29 |

FOREIGN PATENT DOCUMENTS

| | | |
|---|---|---|
| JP | 9-218175 | 8/1997 |
| JP | 2003-12393 | 1/2003 |
| JP | 2005-64054 | 3/2005 |
| JP | 2007-227516 | 9/2007 |

* cited by examiner

*Primary Examiner* — James McDonough
(74) *Attorney, Agent, or Firm* — Clark & Brody

(57) ABSTRACT

When a silicon single crystal is grown by the CZ method using a pulling apparatus in which a voltage can be applied between a crystal suspending member and a crucible, the voltage is applied under the condition that the crystal suspending member is set as a negative electrode while the crucible is set as a positive electrode in a process for growing a lower end portion of a cylindrical portion or a tail portion which is of a non-convertible portion of the silicon single crystal. A sample wafer is collected from the lower end portion of the cylindrical portion or the tail portion, which is grown in association with the voltage application, and the metal contamination of the sample wafer is evaluated. The sample wafer has enough metal impurity concentration to evaluate the metal contamination. The metal contamination is evaluated for each of the sequentially grown silicon single crystals, so that a metal impurity generation behavior in a pulling apparatus, which is a factor in silicon single crystal metal contamination, can assuredly be grasped.

12 Claims, 2 Drawing Sheets

METHOD FOR EVALUATING METAL CONTAMINATION OF SILICON SINGLE CRYSTAL

BACKGROUND OF THE INVENTION

1. Field of the Invention

The present invention relates to a method for evaluating metal contamination of a silicon single crystal grown by the Czochralski method (hereinafter referred to as "CZ" method), particularly to the method for evaluating metal contamination of a silicon single crystal used to recognize a metal impurity generation state in a pulling apparatus, which becomes a factor of silicon single crystal metal contamination.

2. Description of the Related Art

The silicon single crystal is used as raw material for the substrate of a semiconductor device. There are various methods for producing the silicon single crystal. Among others, there is widely adopted the CZ method in which the silicon single crystal is grown by pulling the silicon single crystal from a melt as raw material in a quartz crucible.

FIG. 1 schematically shows a configuration of a pulling apparatus suitable to the silicon single crystal growing by the CZ method. As shown in FIG. 1, a crucible 2 is disposed in a central portion of a chamber 1 constituting an outer frame of the pulling apparatus. The crucible 2 has a dual structure, that is, a quartz crucible 2a which is located inside, and a graphite crucible 2b which is located outside of the quartz crucible 2a and in which the quartz crucible 2a is fitted. The graphite crucible 2b is fixed to an upper end portion of a supporting shaft 3, and the crucible 2 is axially moved up and down through a ascending/descending drive of the supporting shaft 3 while circumferentially rotated through a rotatary drive of the supporting shaft 3.

A resistance heating type heater 4 is disposed outside the crucible 2 in such a manner as surrounding the crucible 2, and further a thermal insulation sleeve 5 is disposed outside the heater 4 along an inner surface of the chamber 1. The heater 4 causes a polycrystalline silicon material filled in the crucible 2 to melt down, thereby forming a raw material melt 6 in the crucible 2.

On the other hand, a crystal suspending member 7 such as a wire is disposed above the crucible 2 coaxially with the supporting shaft 3. The crystal suspending member 7 is axially moved up and down while rotated by a pulling mechanism (not shown) provided in an upper end portion of the chamber 1. A seed crystal 8 is attached to a lower end portion of the crystal suspending member 7. The seed crystal 8 is dipped in the raw material melt 6 in the crucible 2, and the seed crystal 8 is gradually moved up while rotated, thereby growing a silicon single crystal 9 below the seed crystal 8.

A neck portion, a shoulder portion, a cylindrical portion, and a tail portion are sequentially formed in the growth of the silicon single crystal 9. The neck portion is located immediately below the seed crystal 8. In the shoulder portion, a diameter of the silicon single crystal 9 is gradually increased to a required diameter. The cylindrical portion having the required diameter is converted to a silicon wafer as end-product. In the tail portion, the diameter is gradually decreased from the diameter of the cylindrical portion in order to prevent the introduction of the dislocation at the final growth stage.

A graphite heat-shielding member 10 surrounding the silicon single crystal 9 in the middle of pulling-up is provided above the crucible 2 in order to efficiently grow the silicon single crystal 9 free from grown-in defects such as COP and a dislocation cluster. A water-cooling member 11 made of metal such as copper, which surrounds the silicon single crystal 9, is provided in a lower portion of the inside of the heat-shielding member 10.

Electric cables are connected to the crystal suspending member 7 and the supporting shaft 3 from a power supply device 12. The power supply device 12 applies a voltage between the crystal suspending member 7 and the supporting shaft 3, so that the voltage can be applied between the silicon single crystal 9 and the crucible 2 with the raw material melt 6 interposed therebetween.

For example, Japanese Patent Application Publication No. 2003-12393 describes that the single crystal is well grown while the voltage ranging from −50V to +50V is applied between the silicon single crystal and the crucible. Therefore, impurities negatively charged in the raw material melt can be removed from a crystal growth interface into the raw material melt by applying the voltage of −50V to 0V onto the crystal suspending member side, while the metal impurities positively charged in the raw material melt can be removed from the crystal growth interface into the raw material melt by applying the voltage of 0V to +50V onto the crystal suspending member side, so that the generation of the dislocation in the single crystal due to impurities is prevented in growing the single crystal.

The metal impurities contained in the silicon single crystal, particularly heavy metals such as iron, copper, and nickel cause deterioration of a withstand voltage of an oxide film or an increase in leak current after the silicon single crystal is sliced and processed into substrates for a semiconductor device, thereby deteriorating performance of the semiconductor device. The contamination of the silicon single crystal by such metal impurities derives from the polycrystalline materials and various hot-zone components constituting the pulling apparatus, such as the crucible, the heater, the heat-shielding member, and the water-cooling member.

The components constituting the pulling apparatus deteriorate as they are used, and metal impurities are diffused with the deterioration of the components to allow the metal impurities to be taken in to the silicon single crystal during the process for growing the single crystal. Therefore, the silicon single crystal is contaminated by the metal impurities.

In order to grow the high-quality silicon single crystal, it is important that components constituting the pulling apparatus and polycrystalline materials be controlled so as not to allow the metal contamination to occur in the silicon single crystal. Conventionally, a sample wafer is cut out in each of the grown silicon single crystals, and the metal contamination of the sample wafer is sequentially evaluated to grasp time-series behavior how metal impurities are generated in the pulling apparatus, which is a factor in metal contamination, whereby the components of the pulling apparatus are controlled. The metal contamination of the sample wafer is evaluated by either lifetime measurement, an analysis by means of a Surface Photo Voltage (SPV) method, or an analysis by means of a complete dissolution method.

As disclosed in Japanese Patent Application Publication No. 9-218175, in the lifetime measurement, a rate of change of a recombination lifetime of carriers in the sample wafer relative to the time how long the sample wafer is aimed by a laser beam is obtained for the sample wafer collected from the p-type silicon single crystal in which boron is used as a dopant by a Microwave Photo Conductivity Decay (μ-PCD) method, and the presence or absence of iron is detected by the rate of change. When a calibration curve indicating the recombination lifetime is produced in each iron concentration by a Deep Level Transient Spectroscopy (DLTS) method, the iron concentration can be obtained based on the calibration curve.

With reference to the measurement performed by the SPV method, as disclosed in Japanese Patent Application Publication No. 2005-64054, a surface of the sample wafer collected from the p-type silicon single crystal is activated by light shining or heating, a diffusion length of a minority carrier is measured immediately after an Fe—B pair is disassociated by the activation and the diffusion length of the minority carrier is also measured when Fe and B are returned to the Fe—B pair again, and the iron concentration is measured from the diffusion lengths.

With reference to the measurement performed by the complete dissolution method, as disclosed in Japanese Patent Application Publication No. 2007-227516, part of the sample wafer collected from the p-type silicon single crystal is dissolved in a mixed acid of a hydrofluoric acid and a nitric acid, and the concentration of the metal such as the copper in the solution is measured using an atomic absorption spectrophotometer or an inductively coupled plasma-mass spectrometer.

However, in the case where the metal impurity concentration contained in the silicon single crystal, i.e. the sample wafer, is equal to or smaller than the limit of detectability, the metal contamination cannot be evaluated by the lifetime measurement, an analysis by means of the SPV method, and an analysis by means of the complete dissolution method. That is, the metal contamination cannot be evaluated until the metal impurity concentration in the silicon single crystal reaches detectability limit or more, and the time-series behavior of the metal impurity generation in the pulling apparatus cannot be grasped. Therefore, the components of the pulling apparatus are insufficiently controlled, and there is a risk such that the silicon single crystal having tremendous metal contamination may abruptly appear.

SUMMARY OF THE INVENTION

In view of the foregoing, an object of the present invention is to provide a method for evaluating metal contamination of a silicon single crystal, in which the behavior of metal impurity generation can assuredly be grasped in the pulling apparatus in order to grow the high-quality silicon single crystal free from metal contamination.

The inventor eagerly made a study to achieve the above object, and focused attention on the fact that metal impurities in the raw material melt are positively charged by ionization. As a result, the inventor found that the metal impurity concentration in the silicon single crystal can be increased so as to sufficiently enable the metal contamination to be evaluated by taking the positively-charged metal impurities into the silicon single crystal using an electric attraction force, whereby the present invention has been completed.

The present invention provides a method for evaluating metal contamination of a silicon single crystal grown by the CZ method using a pulling apparatus in which a voltage can be applied between a crystal suspending member and a crucible, the method including the steps of setting the crystal suspending member as a negative electrode while setting the crucible as a positive electrode in a process for growing a non-convertible portion of the silicon single crystal where the portion is not converted into a silicon wafer as end-product; applying the voltage; collecting a sample from a region grown in association with the voltage application; and evaluating the metal contamination of the sample.

In such a configuration, since the portion (non-convertible to end-products) which is grown in association with the voltage application while the crystal suspending member is set as the negative electrode is negatively charged, the metal impurities positively charged in the raw material melt can be taken in by the electric attraction force, and the metal impurity concentration is increased. Therefore, the sample collected from the voltage application region has enough metal impurity concentration to evaluate the metal contamination, so that the behavior of metal impurity generation in the pulling apparatus, which becomes a factor in the silicon single crystal metal contamination, can assuredly be grasped by evaluating the metal contamination for each of the sequentially grown silicon single crystals.

As used herein, the "process for growing a non-convertible portion in the silicon single crystal" in which the voltage is applied while the crystal suspending member is set as the negative electrode means a stage in which the shoulder portion, the tail portion, or an upper end portion or a lower end portion of the cylindrical portion is grown in single crystal growing stages. It is preferable that the voltage is applied while the crystal suspending member is set as the negative electrode, and the sample for evaluating metal contamination is collected from the lower end portion of the cylindrical portion or the tail portion at the stage in which the lower end portion of the cylindrical portion or the tail portion is grown. The stage in which the lower end portion of the cylindrical portion or the tail portion is grown is of the final stage of the single crystal growth in the single crystal growing stages.

During the silicon single crystal growth, the silicon single crystal is much lower than the raw material melt in terms of the concentration of the metal impurities having small segregation coefficients to silicon due to a segregation phenomenon of impurity elements. Therefore, because of a correlation with a solidification ratio (ratio of the weight of the pulled silicon single crystal to an initial amount of the raw material melt), the metal impurity concentration in the silicon single crystal is increased as the solidification ratio is raised, that is, as the single crystal growth progresses, and the metal impurity concentration is rapidly increased at the final growth stage in which the solidification ratio is brought close to 100%. For example, at the final growth stage in which the solidification ratio becomes 80%, the metal impurity concentration in the silicon single crystal is increased about five times the initial growth stage in which the solidification ratio remains approximately 0%. Therefore, when the voltage application is performed at the final growth stage while the crystal suspending member is set as the negative electrode, the metal impurity concentration in the sample can further be increased by synergy effect with the segregation effect of the impurity elements, compared with the initial growth stage.

The metal contamination in the sample can be evaluated by the lifetime measurement, the analysis by means of the SPV method, or the analysis by means of the complete dissolution method.

In the process for growing an end-product convertible portion of the silicon single crystal, it is preferable that the voltage is applied under the condition that the crystal suspending member is set as the positive electrode while the crucible is set as the negative electrode, or the voltage is not applied. This is because in growing the end-product convertible portion of the silicon single crystal, applying the voltage while the crystal suspending member is set as the negative electrode should promote the intake of the metal impurities in the end-product convertible portion, incurring the increase of the metal impurity concentration, thereby possibly deteriorating the quality.

According to the method for evaluating metal contamination of a silicon single crystal of the present invention, since the silicon single crystal metal contamination is sufficiently evaluated, the metal impurity generation state in the pulling apparatus, which is a factor in the metal contamination, can assuredly be grasped, and the components of the pulling apparatus can be controlled such that the metal contamination is not generated in the silicon single crystal.

DETAILED DESCRIPTION OF THE PREFERRED EMBODIMENTS

A method for evaluating metal contamination of a silicon single crystal according to an embodiment of the present invention will be described in detail. The method for evaluating metal contamination of a silicon single crystal using a pulling apparatus in which a voltage can be applied between a crystal suspending member and a crucible includes the steps of setting the crystal suspending member as a negative electrode while setting the crucible as a positive electrode in a process for growing "a portion of the silicon single crystal which cannot be converted to a silicon wafer as end-product" ("non-convertible portion"); applying the voltage; collecting a sample from the portion grown in association with the voltage application; and evaluating the metal contamination of the sample.

Figure 1:
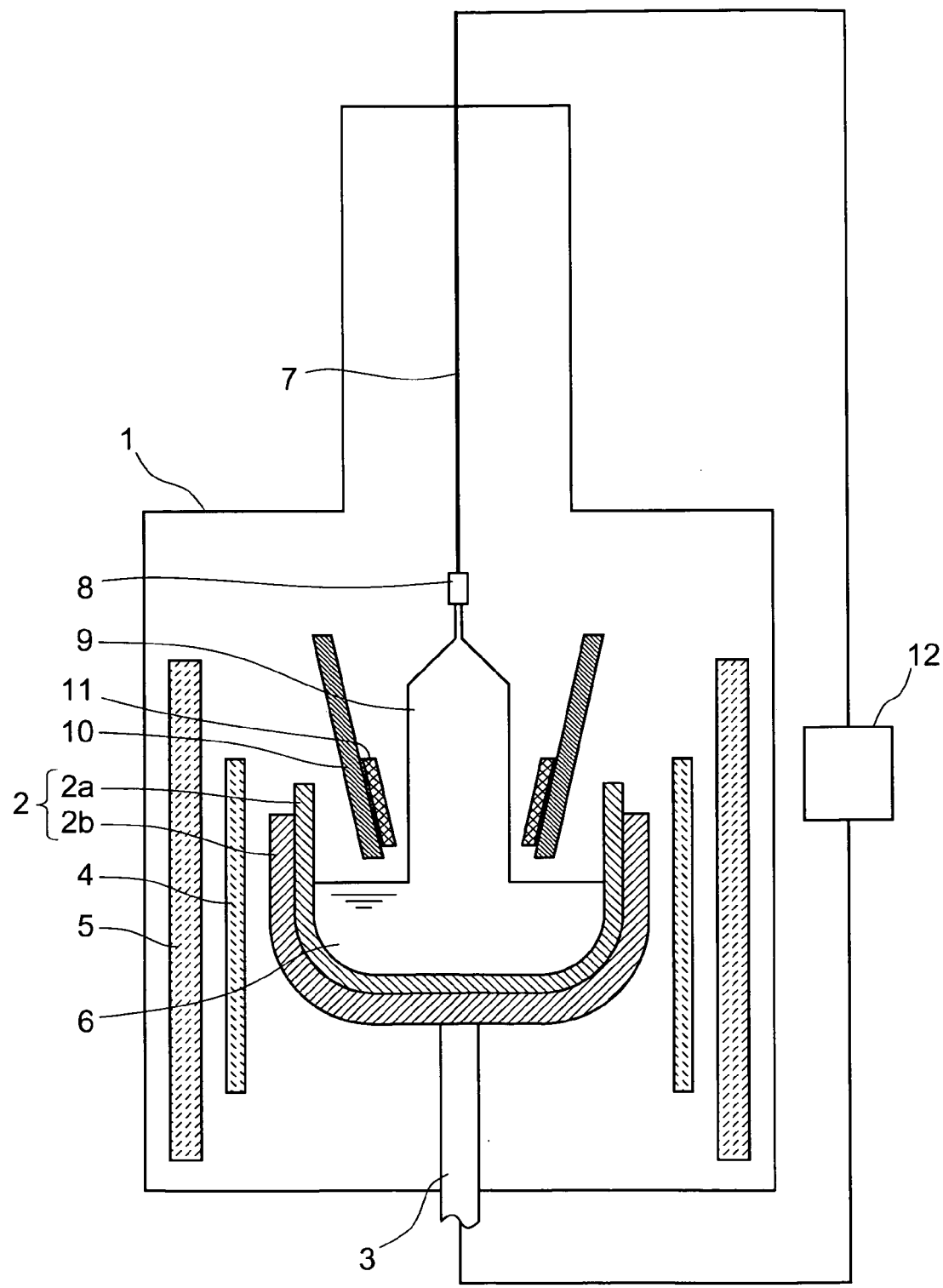
FIG. 1 schematically shows a configuration of a pulling apparatus suitable to a silicon single crystal grown by the CZ method.

FIGS. 2A to 2D are views explaining processes of a method for evaluating metal contamination of a silicon single crystal. At this point, the silicon single crystal is grown using the pulling apparatus of FIG. 1.

Figure 2A:
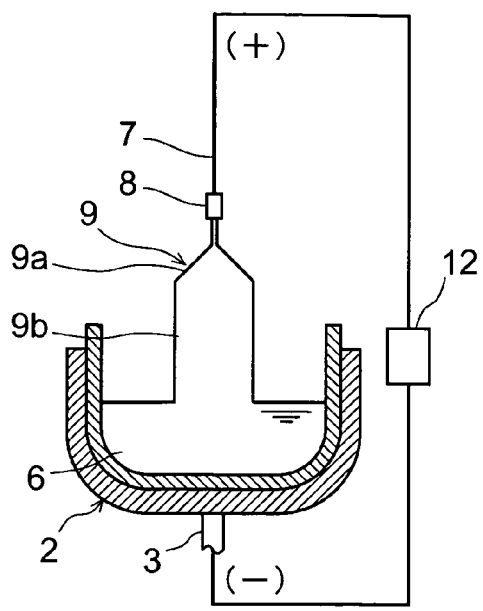
FIGS. 2A to 2D are views explaining processes in a method for evaluating metal contamination of a silicon single crystal according to an embodiment of the present invention.

As shown in FIG. 2A, in cases where a silicon single crystal 9 is grown from a raw material melt 6 in a crucible 2, a shoulder portion 9a is formed after a neck portion is formed, and the diameter of the shoulder portion 9a is enlarged to grow a cylindrical portion 9b having a target diameter.

At this point, a power supply device 12 applies the voltage under the condition that a crystal suspending member 7 is set as a positive electrode (plus: +) while a supporting shaft 3 is set as a negative electrode (minus: −), whereby the voltage is applied under the condition that the silicon single crystal 9 is set as the positive electrode while the crucible 2 is set as the negative electrode with the raw material melt 6 provided interposed between the silicon single crystal 9 and the crucible 2. Since the metal impurities are positively charged in the raw material melt 6, the cylindrical portion 9b in the middle of growing becomes the positive, and the electric repulsion force inhibits the intake of the metal impurities from the raw material melt 6, so that the cylindrical portion 9b can be assured of the quality as an end-product convertible portion.

Figure 2B:
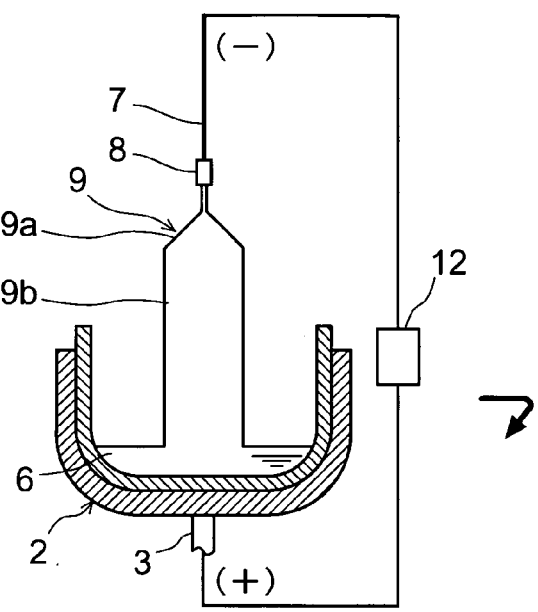

When the single crystal growth reaches a final stage, for example, when the solidification ratio becomes 80%, as shown in FIG. 2B, the power supply device 12 switches the polarities of the applied voltage, where by the power supply device 12 applies the voltage under the condition that the crystal suspending member 7 is set as the negative electrode while the supporting shaft 3 is set as the positive electrode. Therefore, the voltage is applied under the condition that the silicon single crystal 9 is set as the negative electrode while the crucible 2 is set as the positive electrode with the raw material melt 6 provided interposed between the silicon single crystal 9 and the crucible 2.

Figure 2C:
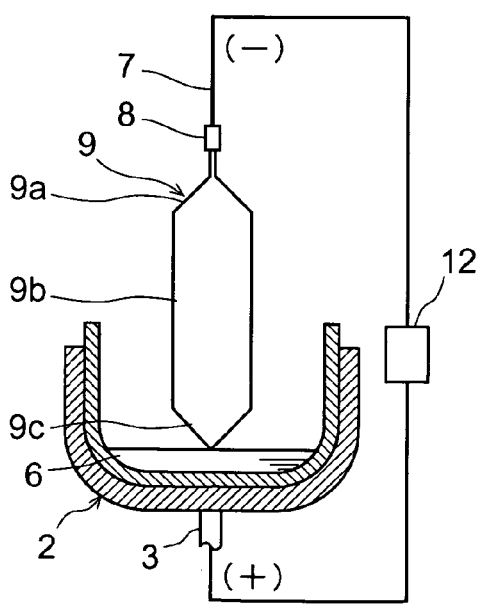

Then a transition to formation of a tail portion 9c is made as shown in FIG. 2C, and the tail portion 9c is formed. Since the crystal suspending member 7 is set as the negative electrode by the voltage application to cause a lower end portion of the cylindrical portion 9b in the middle of growing and the tail portion 9c to become the negative electrode, the intake of the positively charged metal impurities is promoted by the electric attraction force in the raw material melt 6, thereby increasing the metal impurity concentration.

Figure 2D:
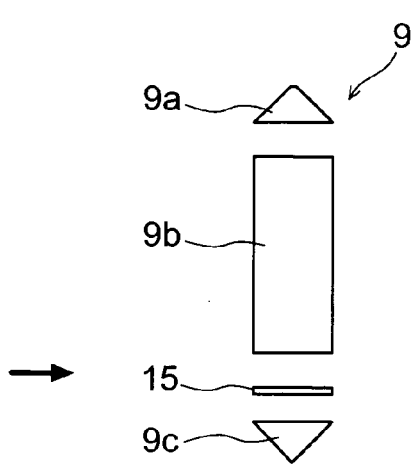

As shown in FIG. 2D, a sample wafer 15 is cut out from the lower end portion of the cylindrical portion 9b in the middle of growing or the tail portion 9c, which is grown in association with the voltage application while the crystal suspending member 7 is set as the negative electrode. FIG. 2D shows an example in which the sample wafer 15 is collected from the lower end portion of the cylindrical portion 9b.

The metal contamination is evaluated for the collected sample wafer 15. The lifetime measurement, the analysis by means of the SPV method, and the analysis by means of the complete dissolution method can be used to evaluate the metal contamination.

The metal contamination is sufficiently evaluated since the sample wafer 15 is collected from the lower end portion of the cylindrical portion 9b or the tail portion 9C, in which the metal impurity concentration is high. The metal contamination is evaluated for each of the sequentially grown silicon single crystals 9, so that the metal impurity generation behavior in the pulling apparatus, which is a factor in silicon single crystal metal contamination, can assuredly be grasped. Accordingly, troubles with or deterioration of each component constituting the pulling apparatus can quickly be dealt with, and the components constituting the pulling apparatus can be controlled such that the metal contamination is not generated in the silicon single crystal.

With reference to the metal contamination evaluating technique, for example, the technique disclosed in Japanese Patent Application Publication No. 9-218175 can be used to measure the lifetime, and the technique disclosed in Japanese Patent Application Publication No. 2005-64054 can be used in the analysis by means of the SPV method. These analysis methods are suitable to the evaluation aimed at iron as the metal impurity since iron contamination can particularly be detected with high accuracy. Further, the technique disclosed in Japanese Patent Application Publication No. 2007-227516 can be used in the measurement performed by the complete dissolution method. The measurement is suitable to the evaluation aimed at the metal impurities such as copper which is hardly detected by the lifetime measurement.

It is preferable that the voltage to be applied by the power supply device ranges from 0.1 to 50V while the crystal suspending member is set as the negative electrode. When the applied voltage is lower than 0.1V, the metal impurities are insufficiently taken in from the raw material melt because of the small effect of electric attraction force imparted to metal ions. On the other hand, when the applied voltage is larger than 50V, the metal impurity intake effect is saturated and the single crystal possibly suffers the dislocation. Both alternating current and direct current can be used for applying the voltage by the power supply device.

A time when the voltage is applied to collect the sample wafer in setting the crystal suspending member as the negative electrode may be at the stage in which the non-convertible portion is grown, or in which the shoulder portion or the upper end portion of the cylindrical portion is grown, that is, at the initial stage of the single crystal growth. In order to effectively obtain the metal impurity concentration increasing effect caused by the segregation of the impurity elements, the time for applying the voltage in setting the crystal suspending member as the negative electrode is preferably at the final stage of the single crystal growth, particularly at the stage in which the solidification ratio becomes 80% or more.

EXAMPLES

The following tests were performed in order to confirm the effect of the method for evaluating metal contamination of a silicon single crystal of the present invention. In the test of the example, the pulling apparatus of FIG. 1 was used, and a crucible having an inner diameter of 22 inches was used. The crucible was filled with a total weight of 140 kg of polycrystalline silicon materials and boron as a dopant, and the polycrystalline silicon materials and boron were melted into a raw material melt to grow a p-type silicon single crystal having a diameter of 200 mm therefrom. At the stage in which the solidification ratio became 80% in growing the cylindrical portion, a direct-current voltage of 10V was applied under the condition that the crystal suspending member was set as the negative electrode while the crucible was set as the positive electrode, and the tail portion was formed.

The sample wafer was collected from the lower end portion of the cylindrical portion of the grown silicon single crystal, and the metal contamination of the sample wafer was evaluated. The metal contamination was evaluated by the lifetime measurement, the analysis by means of the SPV method, and the analysis by means of the complete dissolution method. In a comparative example, after the above silicon single crystal was grown, a silicon single crystal was further grown using the pulling apparatus without applying the voltage, and the sample wafer was collected from the lower end portion of the cylindrical portion of the grown silicon single crystal to evaluate the metal contamination.

In the sample wafer of the comparative example, the metal impurities could not be detected by the lifetime measurement, the analysis by means of the SPV method, and the analysis by means of the complete dissolution method.

On the other hand, in the sample wafer of the example, copper could be detected by the measurement performed by the complete-dissolution-method. The copper was used for the water-cooling member in the pulling apparatus. When the pulling apparatus was disassembled and examined after the single crystal of the comparative example was grown, a minor damage, which presumably should have incurred the copper contamination, could be confirmed in the water-cooling member.

According to the method for evaluating metal contamination of a silicon single crystal of the present invention, the voltage is applied while the crystal suspending member is set as the negative electrode in growing the non-convertible portion, which allows the metal impurities in the raw material melt to be taken in by the electric attraction force to a voltage application region to be grown in association with the voltage application. Therefore, the sample collected from the voltage application region has enough metal impurity concentration to evaluate the metal contamination. Accordingly, the metal contamination is evaluated for each of the sequentially grown silicon single crystals, so that the metal impurity generation behavior in the pulling apparatus, which is a factor in silicon single crystal metal contamination, can assuredly be grasped to control the components constituting the pulling apparatus.

What is claimed is:

1. A method for evaluating metal contamination of a silicon single crystal grown by the Czochralski method using a pulling apparatus in which a voltage can be applied between a crystal suspending member and a crucible, the method comprising the steps of:
setting the crystal suspending member as a negative electrode while setting the crucible as a positive electrode in a process for growing a non-convertible portion of the silicon single crystal;
applying the voltage;
collecting a sample from the non-convertible portion grown in association with the voltage application; and
evaluating the metal contamination of the sample;
wherein, in a process for growing an end-product convertible portion of the silicon single crystal, the voltage is applied under the condition that the crystal suspending member is set as the positive electrode while the crucible is set as the negative electrode, or the voltage is not applied.

2. The method for evaluating metal contamination of a silicon single crystal according to claim 1, wherein the metal contamination of the sample is evaluated by a lifetime measurement.

3. The method for evaluating metal contamination of a silicon single crystal according to claim 1, wherein the voltage to be applied where the crystal suspending member is set as the negative electrode ranges from 0.1 to 50V.

4. The method for evaluating metal contamination of a silicon single crystal according to claim 2, wherein the voltage to be applied where the crystal suspending member is set as the negative electrode ranges from 0.1 to 50V.

5. The method for evaluating metal contamination of a silicon single crystal according to claim 1, wherein the voltage is applied while the crystal suspending member is set as the negative electrode at a growth stage in which a solidification ratio becomes 80% or more.

6. The method for evaluating metal contamination of a, silicon single crystal according to claim 2, wherein the voltage is applied while the crystal suspending member is set as the negative electrode at a growth stage in which a solidification ratio becomes 80% or more.

7. The method for evaluating metal contamination of a silicon single crystal according to claim 3, wherein the voltage is applied while the crystal suspending member is set as the negative electrode at a growth stage in which a solidification ratio becomes 80% or more.

8. The method for evaluating metal contamination of a silicon single crystal according to claim 4, wherein the voltage is applied while the crystal suspending member is set as the negative electrode at a growth stage in which a solidification ratio becomes 80% or more.

9. A method for evaluating metal contamination of a silicon single crystal grown by the Czochralski method using a pulling apparatus in which a voltage can be applied between a crystal suspending member and a crucible, the method comprising the steps of:
setting the crystal suspending member as a negative electrode while setting the crucible as a positive electrode in a process for growing a non-convertible portion of the silicon single crystal;
applying the voltage;
collecting a sample from the non-convertible portion grown in association with the voltage application; and
evaluating the metal contamination of the sample;
wherein the voltage is applied while the crystal suspending member is set as the negative electrode at a growth stage in which a solidification ratio becomes 80% or more.

10. The method for evaluating metal contamination of a silicon single crystal according to claim 9, wherein the metal contamination of the sample is evaluated by a lifetime measurement.

11. The method for evaluating metal contamination of a silicon single crystal according to claim 9, wherein the voltage to be applied where the crystal suspending member is set as the negative electrode ranges from 0.1 to 50V.

12. The method for evaluating metal contamination of a silicon single crystal according to claim 10, wherein the voltage to be applied where the crystal suspending member is set as the negative electrode ranges from 0.1 to 50V.

\* \* \* \* \*

UNITED STATES PATENT AND TRADEMARK OFFICE
CERTIFICATE OF CORRECTION

PATENT NO.         : 8,475,589 B2
APPLICATION NO.    : 12/385386
DATED              : July 2, 2013
INVENTOR(S)        : Shunji Kuragaki It is certified that error appears in the above-identified patent and that said Letters Patent is hereby corrected as shown below:

In the Claims:

Column 8, line 37:

"6. The method for evaluating metal contamination of a,"

should read

"6. The method for evaluating metal contamination of a"

Signed and Sealed this
Third Day of December, 2013

Margaret A. Focarino
*Commissioner for Patents of the United States Patent and Trademark Office*